United States Patent
Kong et al.

(10) Patent No.: US 12,310,262 B2
(45) Date of Patent: May 20, 2025

(54) PHASE CHANGE MEMORY WITH ENCAPSULATED PHASE CHANGE ELEMENT

(71) Applicant: International Business Machines Corporation, Armonk, NY (US)

(72) Inventors: Dexin Kong, Redmond, WA (US); Kangguo Cheng, Schenectady, NY (US); Juntao Li, Cohoes, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 617 days.

(21) Appl. No.: 17/519,924

(22) Filed: Nov. 5, 2021

(65) Prior Publication Data

US 2023/0144050 A1 May 11, 2023

(51) Int. Cl.
*H10N 70/00* (2023.01)
*H10N 70/20* (2023.01)

(52) U.S. Cl.
CPC ......... *H10N 70/068* (2023.02); *H10N 70/826* (2023.02); *H10N 70/231* (2023.02); *H10N 70/8413* (2023.02); *H10N 70/8828* (2023.02)

(58) Field of Classification Search
CPC .................................................. H10N 70/231
See application file for complete search history.

(56) References Cited

U.S. PATENT DOCUMENTS

| | | | |
|---|---|---|---|
| 7,642,125 B2 | 1/2010 | Lung et al. | |
| 7,803,655 B2 | 9/2010 | Johnson et al. | |
| 8,008,643 B2 | 8/2011 | Lung | |
| 8,138,028 B2 | 3/2012 | Lung et al. | |
| 8,633,464 B2 * | 1/2014 | Breitwisch | H10N 70/8828 257/3 |
| 8,896,045 B2 | 11/2014 | Philipp et al. | |
| 9,064,793 B2 | 6/2015 | Liu | |
| 10,903,422 B2 * | 1/2021 | Leobandung | H10N 70/063 |
| 11,239,418 B2 * | 2/2022 | Cheng | H10N 70/066 |
| 11,380,843 B2 * | 7/2022 | Shen | H10N 70/826 |
| 2007/0025226 A1 | 2/2007 | Park et al. | |
| 2014/0117302 A1 | 5/2014 | Goswami | |
| 2016/0197013 A1 * | 7/2016 | Backes | H01L 21/31111 438/627 |
| 2021/0098532 A1 * | 4/2021 | Wu | H10N 70/826 |

FOREIGN PATENT DOCUMENTS

WO 2006/069933 A1 7/2006

OTHER PUBLICATIONS

Wong, H.-S. P., et al., "Phase Change Memory", Proceedings of the IEE, Dec. 2010, pp. 2201-2227, vol. 98, No. 12.

* cited by examiner

*Primary Examiner* — Mounir S Amer
(74) *Attorney, Agent, or Firm* — Scully, Scott, Murphy & Presser, P.C.; Yuanmin Cai

(57) ABSTRACT

Semiconductor devices and methods for forming the semiconductor devices are described. An example semiconductor structure can include a substrate including a first electrode. The example semiconductor structure can further include a heater element directly contacting the first electrode in the substrate. The example semiconductor structure a phase change cell directly on the heater element. The sidewalls of the phase change cell can be encapsulated with a spacer. The example semiconductor structure a second electrode directly on the phase change cell and the spacer.

9 Claims, 11 Drawing Sheets

PHASE CHANGE MEMORY WITH ENCAPSULATED PHASE CHANGE ELEMENT

BACKGROUND

The present disclosure relates in general to semiconductor devices and methods of manufacturing semiconductor devices and, in particular, to phase change memory devices with encapsulated phase change element.

Phase change materials can change phase between an amorphous state and a crystalline state by application of specific levels of electrical current or voltage. The amorphous state can be characterized by a relatively higher electrical resistivity than the crystalline state, causing different levels of voltages or current being used for setting the phase of the phase change material. A phase change memory element can use phase change material to increase memory capacity. In an aspect, the different voltage or current levels being applied to change phase among an off state (e.g., no voltage or current applied), the amorphous state, the crystalline state, and different types of the crystalline state, can cause the phase change memory to represent more than two values (e.g., binary) of data that can be stored in a phase change memory element. In an aspect, during fabrication of phase change memory, it may be undesirable to expose phase change materials because exposed phase change material can cause issues such as contamination of manufacturing tools, changes to the phase change material properties, and environmental concerns with respect to the phase change material.

SUMMARY

In one embodiment, a semiconductor structure is generally described. The semiconductor structure can include a substrate including a first electrode. The semiconductor structure can further include a heater element directly contacting the first electrode in the substrate. The semiconductor structure can further include a phase change cell directly on the heater element. The sidewalls of the phase change cell can be encapsulated with a spacer. The semiconductor structure can further include a second electrode directly on the phase change cell and the spacer.

In one embodiment, a method for forming a phase change memory element is generally described. The method can include depositing a phase change material layer directly on a heater element in a first substrate. The heater element can be directly on a first electrode of a second substrate. The method can further include depositing a hard mask directly on the phase change material layer. The method can further include forming a phase change structure using the hard mask. The method can further include etching the phase change structure to form a phase change cell. The etching of the phase change structure causes the hard mask to overhang on the phase change cell. The method can further include forming a spacer to encapsulate the phase change cell. The method can further include depositing a second electrode on the hard mask.

In one embodiment, a memory array is generally described. The memory array can include a first decoder, a second decoder, a plurality of phase change memory cells, a plurality of bit lines connecting the plurality of phase change memory cells to the first decoder, and a plurality of word lines connecting the plurality of phase change memory cells to the second decoder. Each phase change memory cell among the plurality of phase change memory cells can include a substrate including a first electrode. The phase change memory cell can further include a heater element directly contacting the first electrode in the substrate. The phase change memory cell can further include a phase change cell directly on the heater element. The sidewalls of the phase change cell can be encapsulated with a spacer. The phase change memory cell can further include a second electrode directly on the phase change cell and the spacer.

Further features as well as the structure and operation of various embodiments are described in detail below with reference to the accompanying drawings. In the drawings, like reference numbers indicate identical or functionally similar elements.

DETAILED DESCRIPTION

Figure 1:
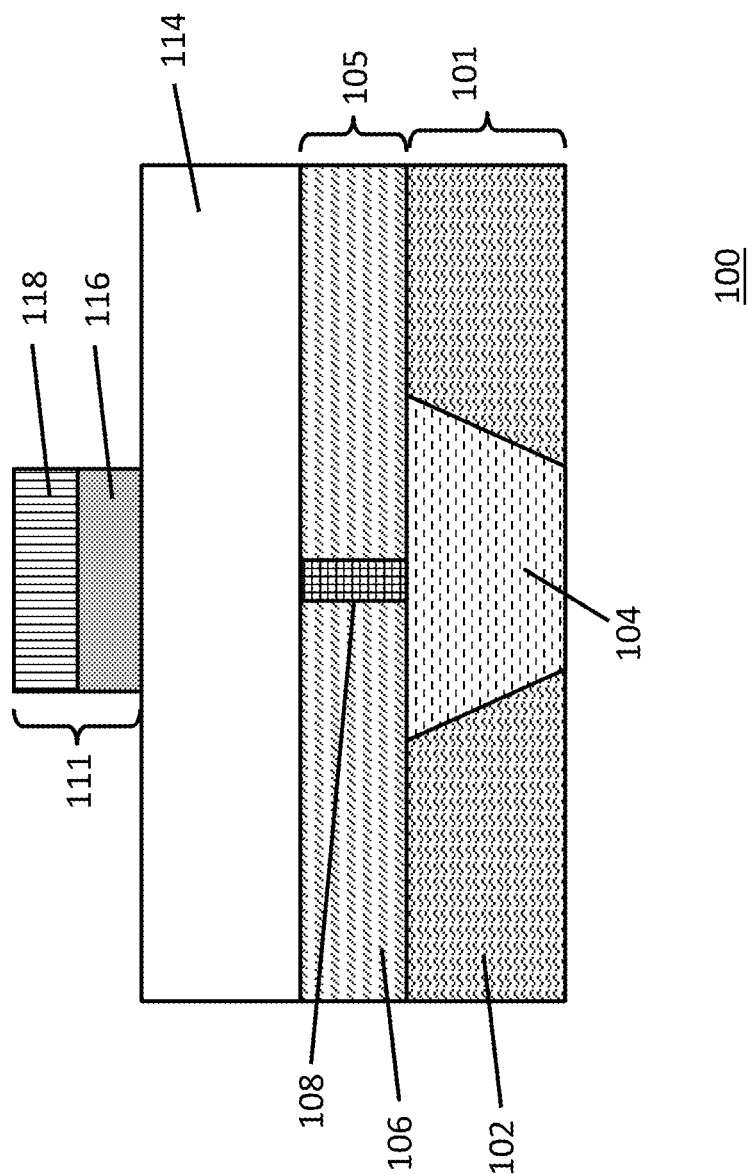
FIG. 1 is a cross sectional view of an exemplary structure that can be used for forming phase change memory with encapsulated phase change element in one embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The methods described herein can form phase change memory (PCM) with solid encapsulation of, for example, germanium-antimony-tellurium (GST) during downstream processing. In an aspect, the methods allow for avoiding exposure of phase change materials. In one embodiment, after patterning the phase change material, a lateral trimming process is performed to selectively etch the phase change material in a lateral direction to create an overhang of a hard mask on top of phase change material. A conformal dielectric spacer is deposited and etched to form a spacer on the sidewalls of the phase change material and under the overhanging portions of the hard mask. The overhang in hard mask can protect the spacer on the sidewalls of the phase change material from being eroded. As a result, the phase change material is completely sealed by the spacer, eliminating the risk of exposing the phase change material.

FIG. 1 is a cross sectional view of an exemplary structure that can be used for forming phase change memory with encapsulated phase change element in one embodiment. The structure 100 can be a deposition stack including a substrate 101, a substrate 105, a phase change material layer 114, and a hard mask 111. The substrate 101 can include a dielectric portion 102 and a bottom electrode 104. The dielectric portion 102 can include dielectric materials having low dielectric coefficients (e.g., low k dielectrics, or dielectrics with dielectric constant lower than the dielectric constant of silicon dioxide). In one or more embodiments, the substrate 101 can be deposited on another substrate. In one or more embodiments, the substrate can be an integrated circuit component such as, for example, a field effect transistor, and via can be, for example, a metal interconnect. In one or more embodiments, the bottom electrode 104 can be formed by depositing an electrically conductive material, such as metal or metallic compound, for example, titanium nitride (TiN) or tungsten (W). in a trench or channel formed in the substrate 101.

The substrate 105 can be deposited directly on the substrate 101. The substrate 105 can include a dielectric portion 106 and a heater element 108. The dielectric portion 106 can include dielectric materials having low dielectric coefficients (e.g., low k dielectrics). In one or more embodiments, the heater element 108 can be formed by depositing heater materials in a via or a pore, trench or channel patterned in the substrate 105. Some examples of heater materials can include, but not limited to, titanium nitride, silicon carbide (SiC), graphite, tantalum nitride (TaN), tungsten nitride (WN), titanium tungsten (TiW), or titanium aluminide (TiAl) or other electrically conducting material. The heater element 108 can have a relatively narrow cross-sectional area, which focus electrical current that is run through PCM material layer 114. This allows heater element to generate heat through resistive heating during a pulse of electricity, which can be used to selectively change the temperature of the phase change material layer 114, for example, above the crystallization temperature and the melting temperature of phase change material. In one or more embodiments, the heater element 108 can include multiple different electrically conductive materials that can be arranged in multiple layers.

The phase change material layer 114 can be formed by depositing phase change materials, such as germanium-antimony-tellurium (GST), directly on the substrate 105. In one or more embodiments, other suitable materials for the phase change material include silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, germanium-indium-antimony-tellurium (Ge—In—Sb—Te) alloys, germanium-antimony (Ge—Sb) alloys, antinomy-tellurium (Sb—Te) alloys, silicon-antinomy (Si—Sb) alloys, and combinations thereof. In some embodiments, the phase change material can further include nitrogen, carbon, and/or oxygen. A hard mask 111 can be deposited directly on the phase change material layer 114. In one embodiment, the hard mask 111 can be a bi-layer hard mask including a hard mask layer 116 and a hard mask layer 118, where the hard mask layer 118 is deposited directly on the hard mask layer 116. In one embodiment, the hard mask layer 116 can be a titanium nitride (TiN) hard mask, and the hard mask 118 can be a silicon nitride (SiN) hard mask.

Figure 2:
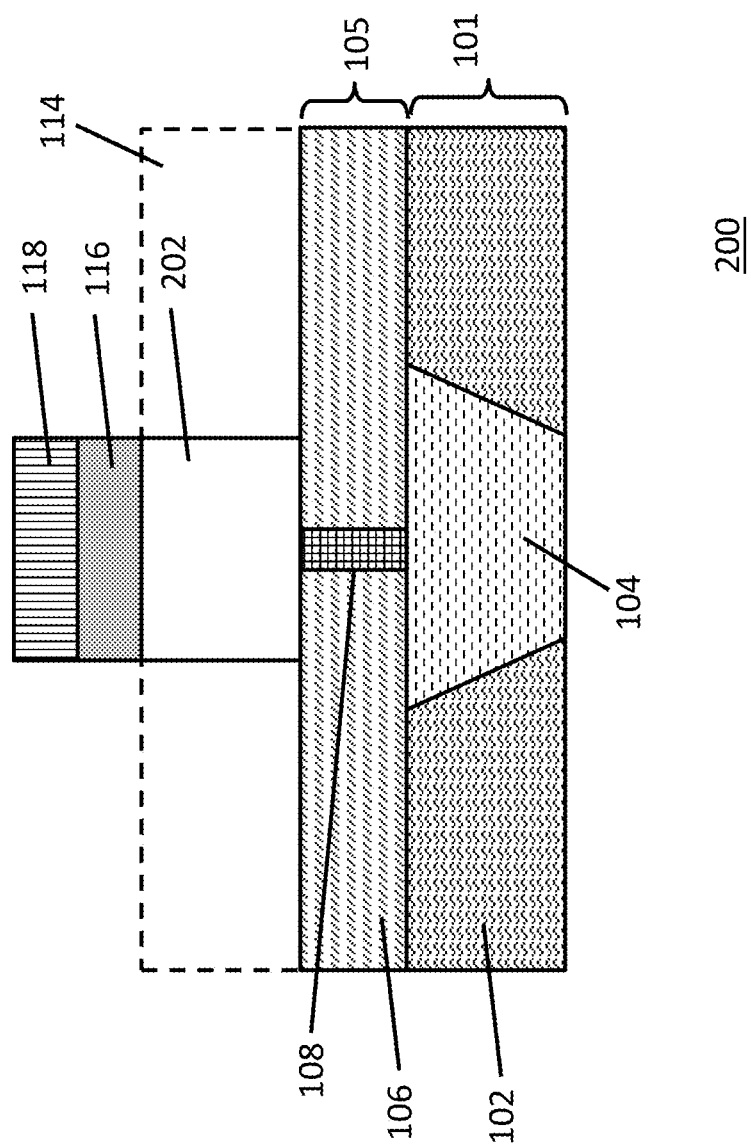
FIG. 2 is a cross sectional view of a structure formed after patterning a phase change material layer of the exemplary structure of FIG. 1 in one embodiment.

FIG. 2 is a cross sectional view of a structure formed after patterning a phase change material layer of the exemplary structure of FIG. 1 in one embodiment. In one embodiment, the structure 100 in FIG. 1 can undergo an etching or a patterning process to form another structure 200. To form the structure 200, the structure 100 can undergo an etching process to etch or pattern the phase change material layer 114 into phase change structure 202. The etching process to form the phase change structure 202 can use the hard mask 116 and 118 to pattern a shape of the phase change structure 202. In one embodiment, etching processes that can be used for forming the phase change structure 202 can include anisotropic dry or directional reactive ion etching (RIE) process using various chemicals.

Figure 3:
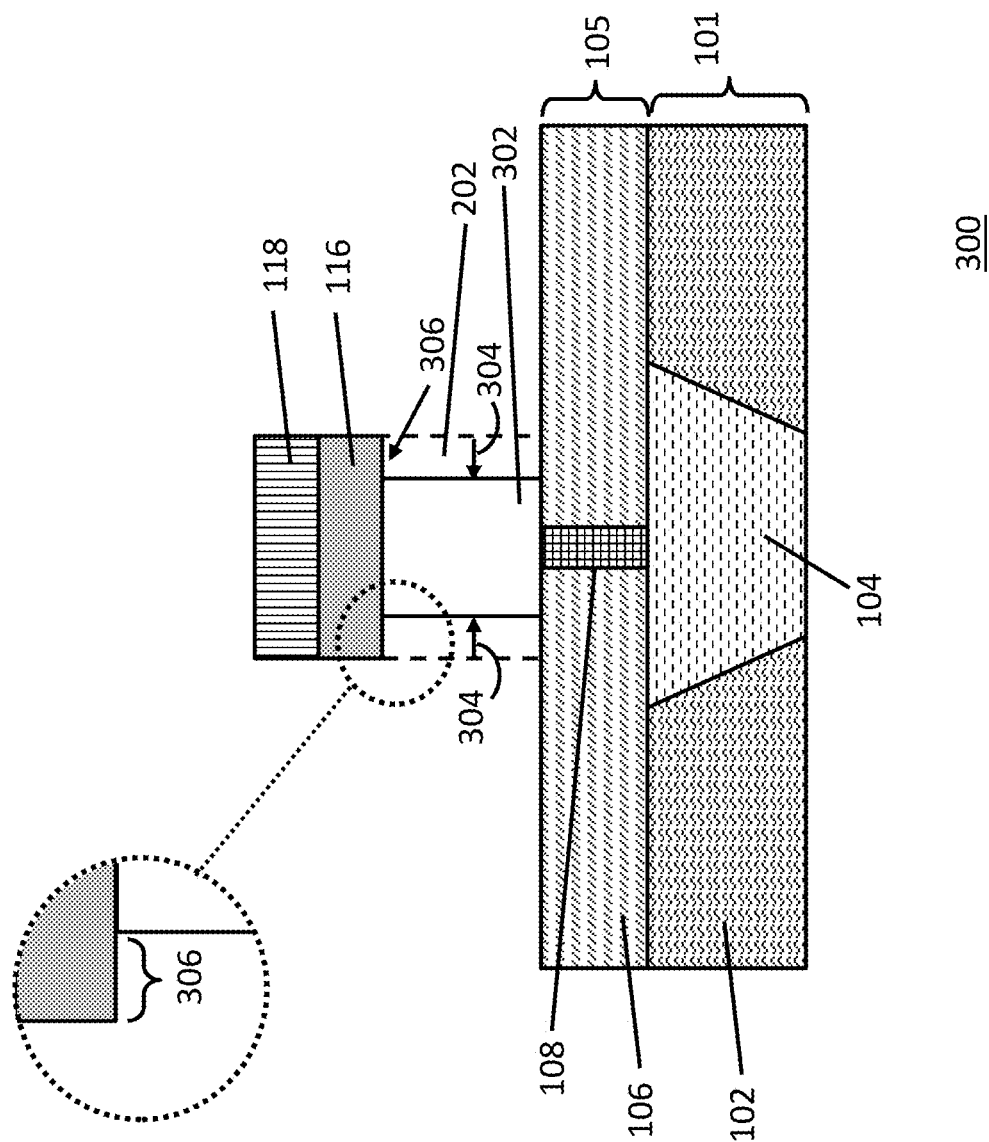
FIG. 3 is a cross sectional view of a structure formed after etching a phase change material structure of the exemplary structure of FIG. 2 in one embodiment.
Figure 4:
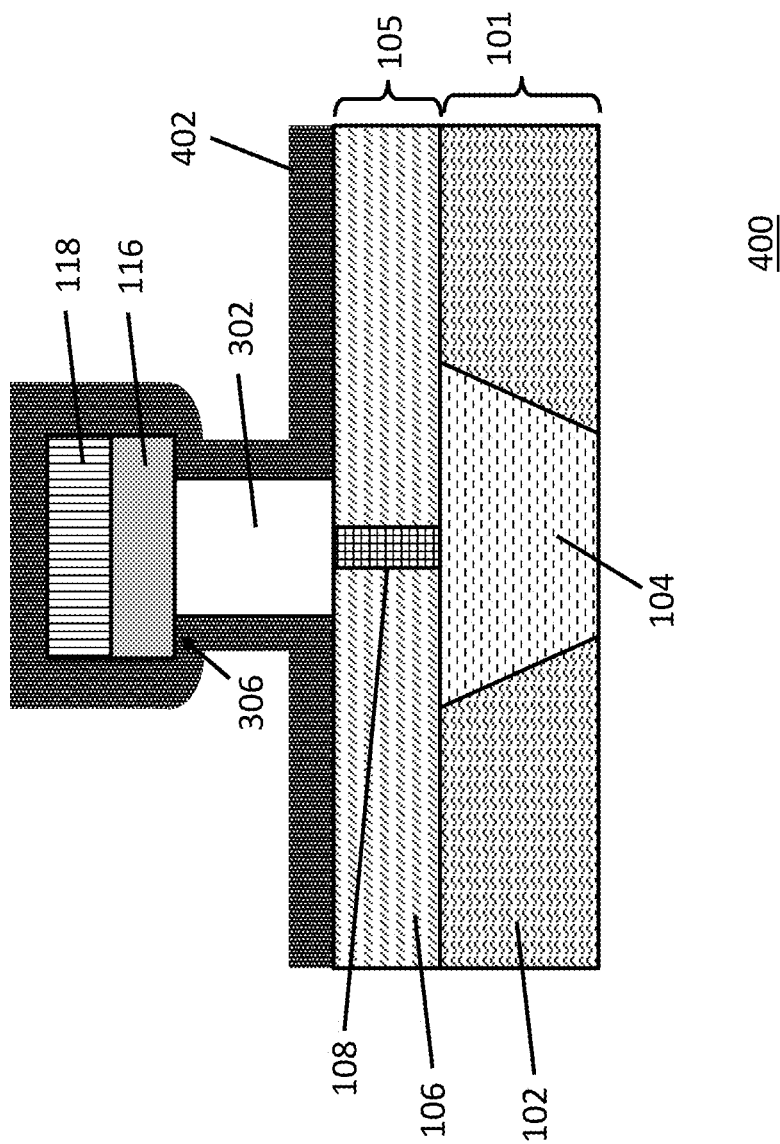
FIG. 4 is a cross sectional view of a structure formed after depositing a spacer on the exemplary structure of FIG. 3 in one embodiment.

FIG. 3 is a cross sectional view of a structure formed after etching a phase change material structure of the exemplary structure of FIG. 2 in one embodiment. In one embodiment, the structure 200 in FIG. 2 can undergo an etching or a patterning process to form another structure 300. To form the structure 300, the structure 200 can undergo an etching process to etch or pattern the phase change structure 202 into a phase change cell 302. The etching process to form the phase change cell 302 can be a selective isotropic wet etch process selective to the material of the phase change material layer 114. For example, the selective wet etch process can be selective to GST such that GST materials of the phase change structure 202 can be etched at a faster rate when compared to an etch rate of other materials. Further, the etching process to form the phase change cell 302 can also be a lateral etching process. For example, the phase change structure 202 can be etched in a lateral direction 304 that is parallel to underlying layers (e.g., substrates 101, 105) and orthogonal to sidewalls of the underlaying layers. In response to etching the phase change structure 202 to form the phase change cell 302, the hard mask 116 and the hard mask 118 can overhang the phase change cell 302 by an offset 306. In one or more embodiments, the lateral etch depth (e.g., offset 306) may have a range from 5 nanometers (nm) to 30 nm, or other arbitrary values depending on a desired implementation of the structures and devices described herein FIG. 4 is a cross sectional view of a structure formed after depositing a spacer on the exemplary structure of FIG. 3 in one embodiment. In one embodiment, a spacer deposition can be performed to deposit a lateral or conformal spacer 402 directly on the structure 300 in FIG. 3 to form another structure 400. The conformal spacer 402 can be composed of thermally and electrically insulated spacer materials such as silicon nitride (SiN), silicon carbide nitride (SiCN), silicon oxide (SiO) or other spacer materials. The spacer deposition to deposit the conformal spacer 402 can conform to contours of a surface of the structure 300. The surface of the structure 300 can include a top surface of the substrate 105, the sidewalls of the phase change cell 302, a bottom surface of the hard mask 116 including the overhanging portions with offsets 306, sidewalls of the hard masks 116 118, a top surface of the hard mask 118. In one or more embodiments, the lateral or conformal spacer 402 may have a thickness that ranges from 5 nm to 10 nm, or other arbitrary values depending on a desired implementation of the structures and devices described herein.

Figure 5:
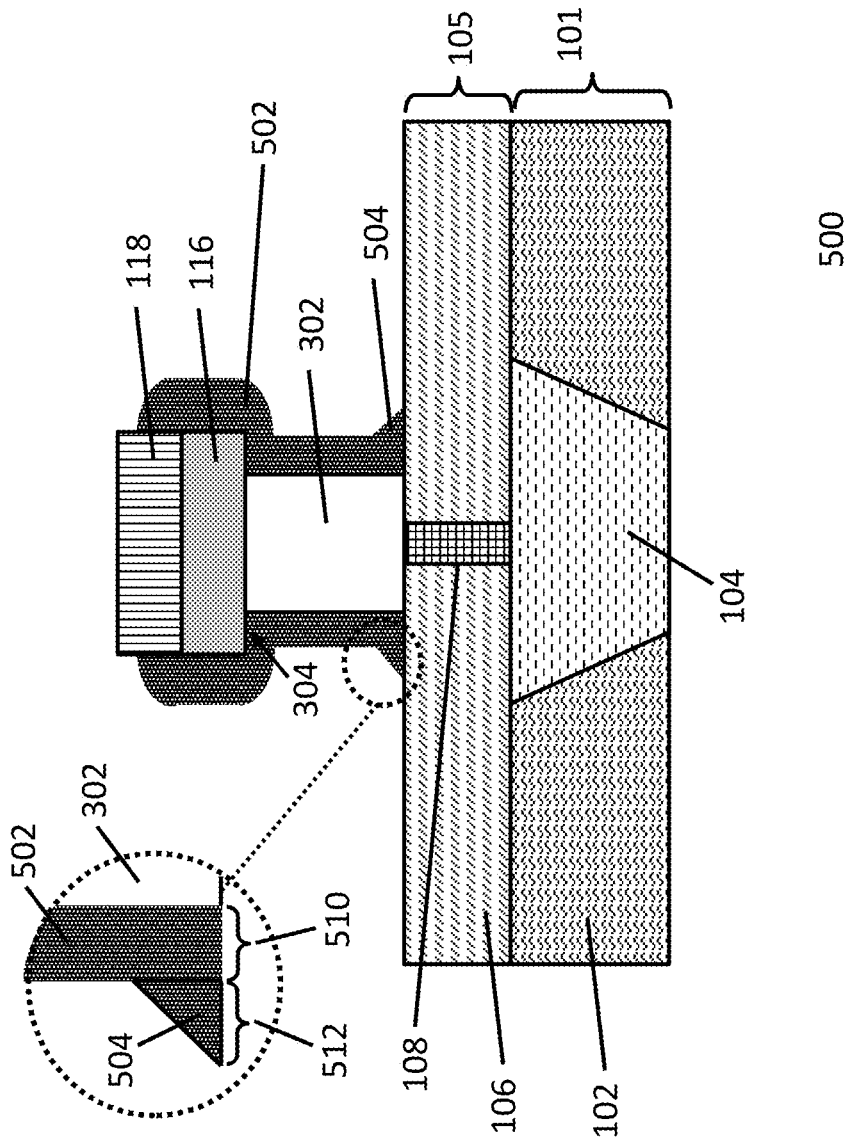
FIG. 5 is a cross sectional view of a structure formed after etching the spacer on the exemplary structure of FIG. 4 in one embodiment.

FIG. 5 is a cross sectional view of a structure formed after etching the spacer on the exemplary structure of FIG. 4 in one embodiment. In one embodiment, the structure 400 in FIG. 4 can undergo an etching or a patterning process to form another structure 500. To form the structure 500, the conformal spacer of FIG. 4 can undergo directional reactive ion etch (RIE) to form a spacer 502. The directional RIE can also remove a portion of spacer material on the surface of the hard mask 118. For example, as shown in FIG. 5, a portion of the spacer 502 can remain on a portion of the sidewalls of the hard mask 118 in response to the directional RIE process. A duration of the directional RIE process can be programmed to cause some of the spacer material to remain on the sidewalls of the hard mask 118. Such programming can ensure that the sidewalls of the hard mask 116 is completely covered by the spacer 502. In one embodiment, in response to the directional RIE, a spacer foot 504 can remain on the surface of the substrate 105. The spacer foot 504 can provide additional protection to the phase change cell 302. For example, a combination of a width or thickness 510 of the spacer 502, with a width 512 of the spacer foot 504, can provide additional protection to a connection point between the phase change cell 302 and the substrate 105 when compared to the thickness 510 of the spacer 502 (e.g., when the spacer foot 504 is absent).

Figure 6:
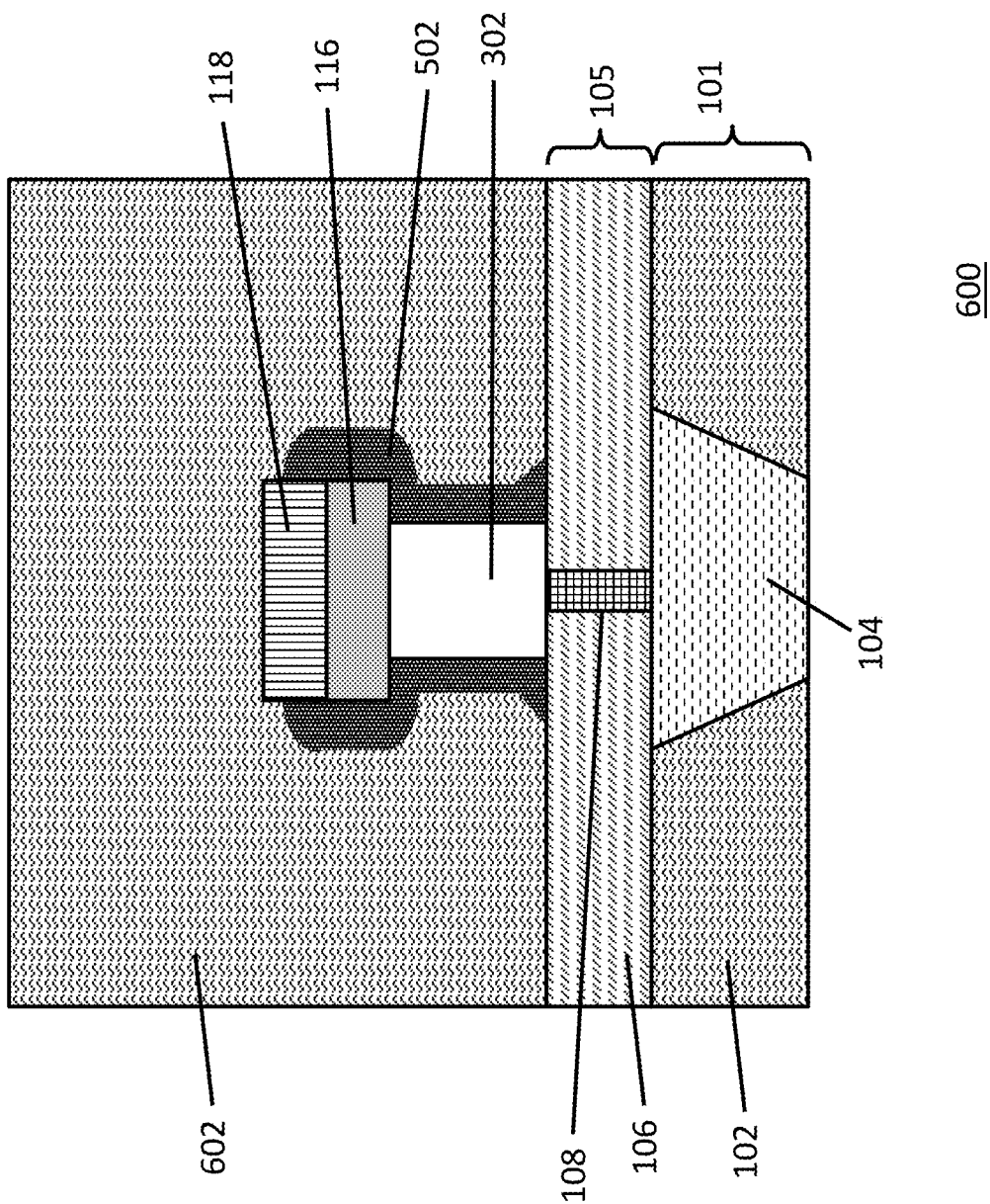
FIG. 6 is a cross sectional view of a structure formed after depositing a dielectric layer on the exemplary structure of FIG. 5 in one embodiment.

FIG. 6 is a cross sectional view of a structure formed after depositing a dielectric layer on the exemplary structure of FIG. 5 in one embodiment. In one embodiment, the structure 500 in FIG. 5 can undergo a deposition process to form another structure 600. To form the structure 600, a layer of dielectric materials can be deposited on the structure 500, forming the dielectric layer 602. A planarization process can also be performed on the dielectric layer 602 to planarize a top surface of the dielectric layer 602. The dielectric material being deposited to form the dielectric layer 602 can include, for example, dielectric materials having low dielectric coefficients (e.g., low k dielectrics).

Figure 7:
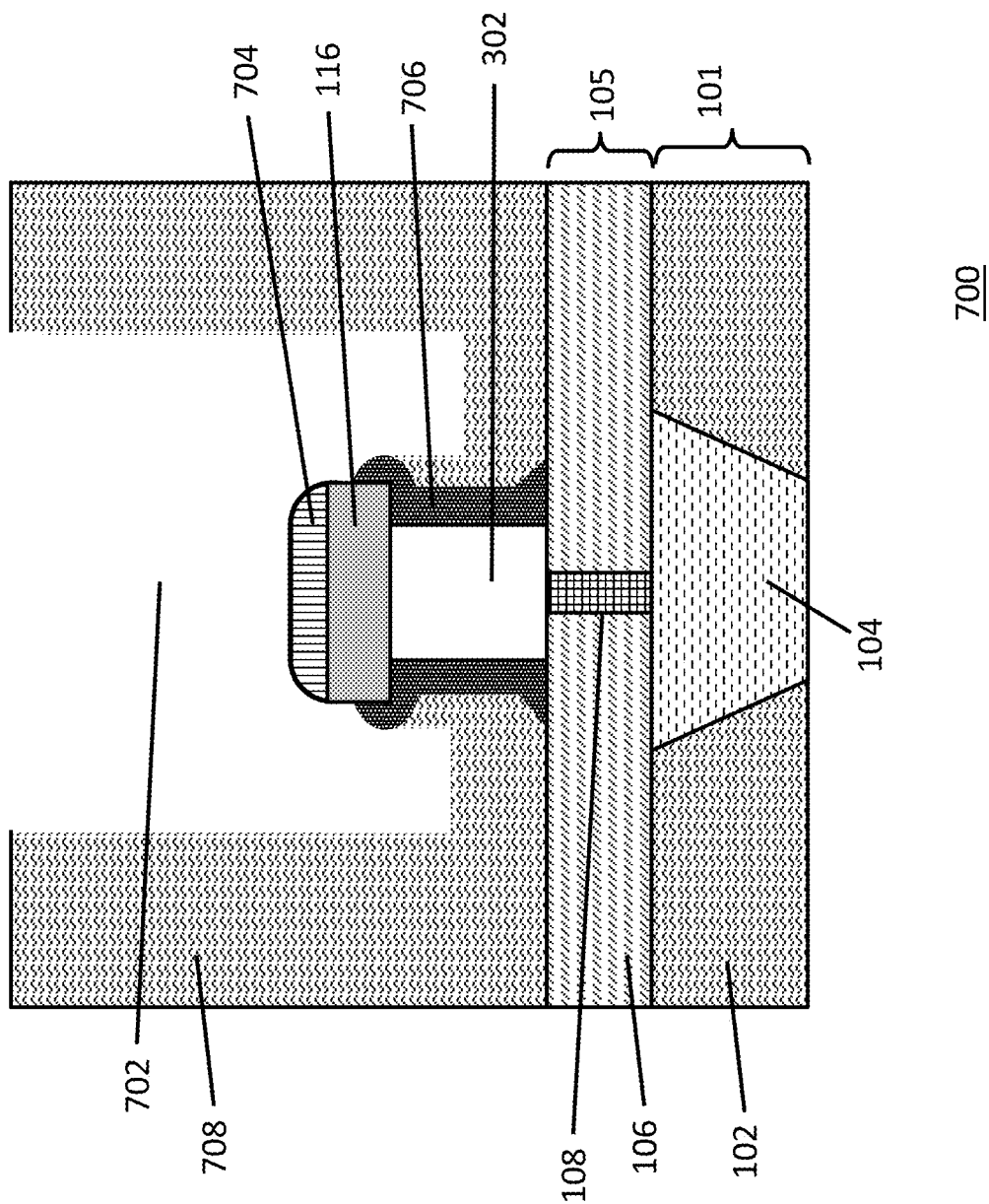
FIG. 7 is a cross sectional view of a structure formed after creating a trench in a dielectric layer of the exemplary structure of FIG. 6 in one embodiment.

FIG. 7 is a cross sectional view of a structure formed after creating a trench in a dielectric layer of the exemplary structure of FIG. 6 in one embodiment. In one embodiment, the structure 600 in FIG. 6 can undergo an etching or a patterning process to form another structure 700. To form the structure 700, the dielectric layer 602 in FIG. 6 can undergo a RIE process to form a trench or channel 702, and dielectric materials 708 can remain in the structure 700. In one embodiment, the RIE process can further pull down or etch into the hard mask 118 and the spacer 502 (see FIG. 5, FIG. 6) to remove a portion of the hard mask 118 and/or the spacer 502. For example, the RIE process to form the trench 702 can be a selective RIE process that is selective to the dielectric materials of the dielectric layer 602 (e.g., etch rate of the dielectric material of dielectric layer 602 is greater than etch rate of the hard mask material of hard mask 118 and the spacer material of the spacer 502). The remaining hard mask material remaining from the hard mask 118 can be a hard mask portion 704 remaining directly on the hard mask 116. The remaining spacer material remaining from the spacer 502 can be a spacer 706 remaining directly on the sidewalls of the hard mask 116 and the phase change cell 302.

In one embodiment, the spacer 706 can remain directly on the entirety of the sidewalls of the hard mask 116, or parts of the sidewalls of the hard mask 116 (as shown in FIG. 7). In one embodiment, the overhanging portion (e.g., offset 306 in FIG. 3) can protect the phase change cell 302 during the RIE process to form the trench 702. For example, the overhang portion of the hard mask 116 having the offset 306 can prevent the spacer materials underneath the overhang portion of the hard mask 116 from being etched in the RIE process to form the trench 702.

Figure 8:
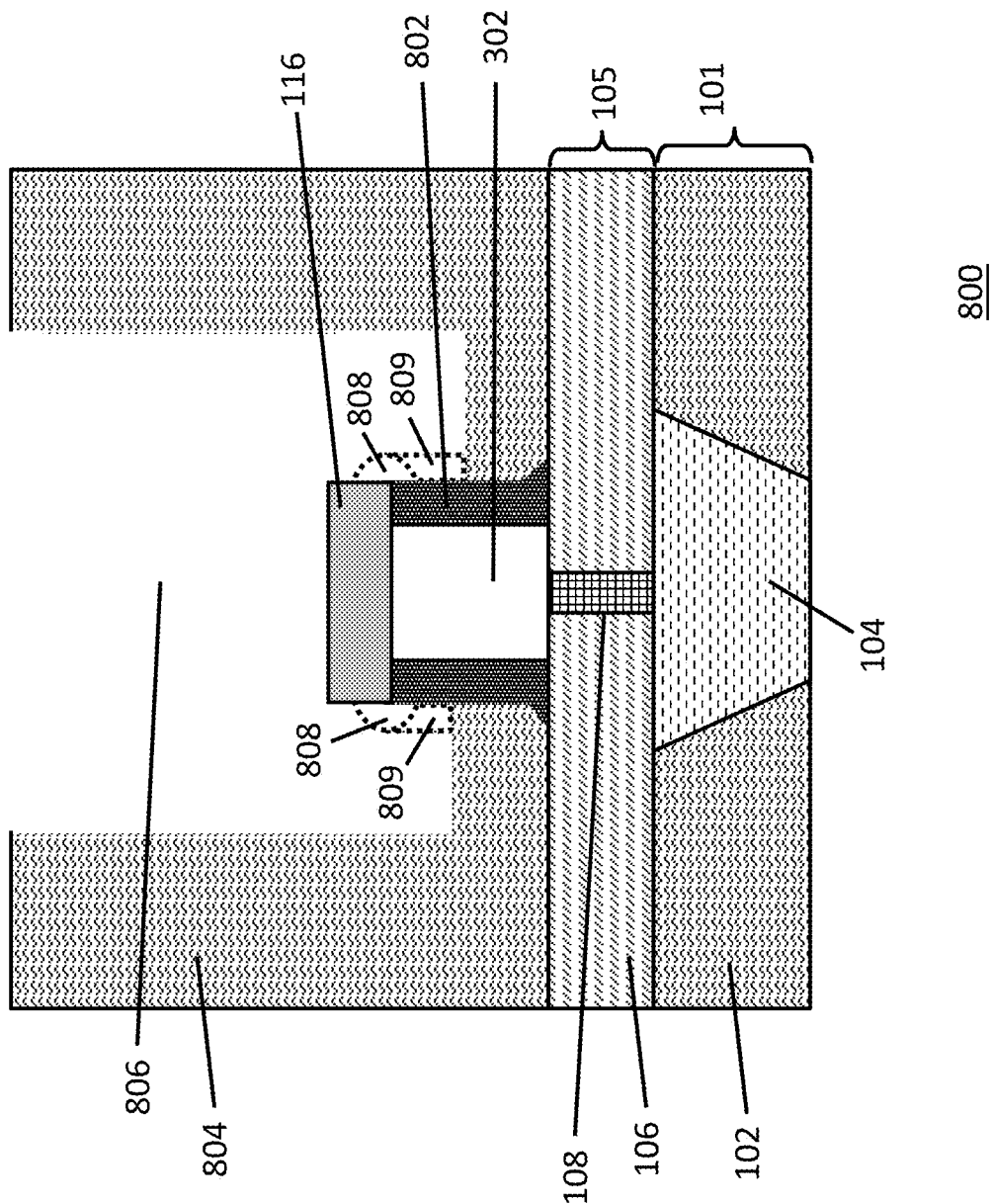
FIG. 8 is a cross sectional view of a structure formed after removing a hard mask layer and patterning a spacer of the exemplary structure of FIG. 7 in one embodiment.

FIG. 8 is a cross sectional view of a structure formed after removing a hard mask layer and patterning a spacer of the exemplary structure of FIG. 7 in one embodiment. In one embodiment, the structure 700 in FIG. 7 can undergo an etching or a patterning process to form another structure 800. To form the structure 800, the hard mask portion 704 in FIG. 7 can be removed by, for example, a RIE process. Further, portions 808 of the spacer 706 can be removed by the RIE process to form a spacer 802. In an embodiment, portions 809 of the dielectric materials 708 can also be removed by the RIE process. In an aspect, removing the portions 809 from dielectric 708 results in dielectric materials 804. As shown in FIG. 8, the spacer 802 encapsulates the phase change cell 302 and the phase change cell 302 is prevented from being exposed. The RIE process, which removes the hard mask 118, transforms the trench 702 in FIG. 7 to a trench 806. In one embodiment, if the hard mask 118 and the spacer 706 are composed of the same materials, such as silicon nitride, the RIE process to form the structure 800 can be selective to nitride to remove the hard mask 118 and a portion (e.g., portion 808) of the spacer 706.

Figure 9:
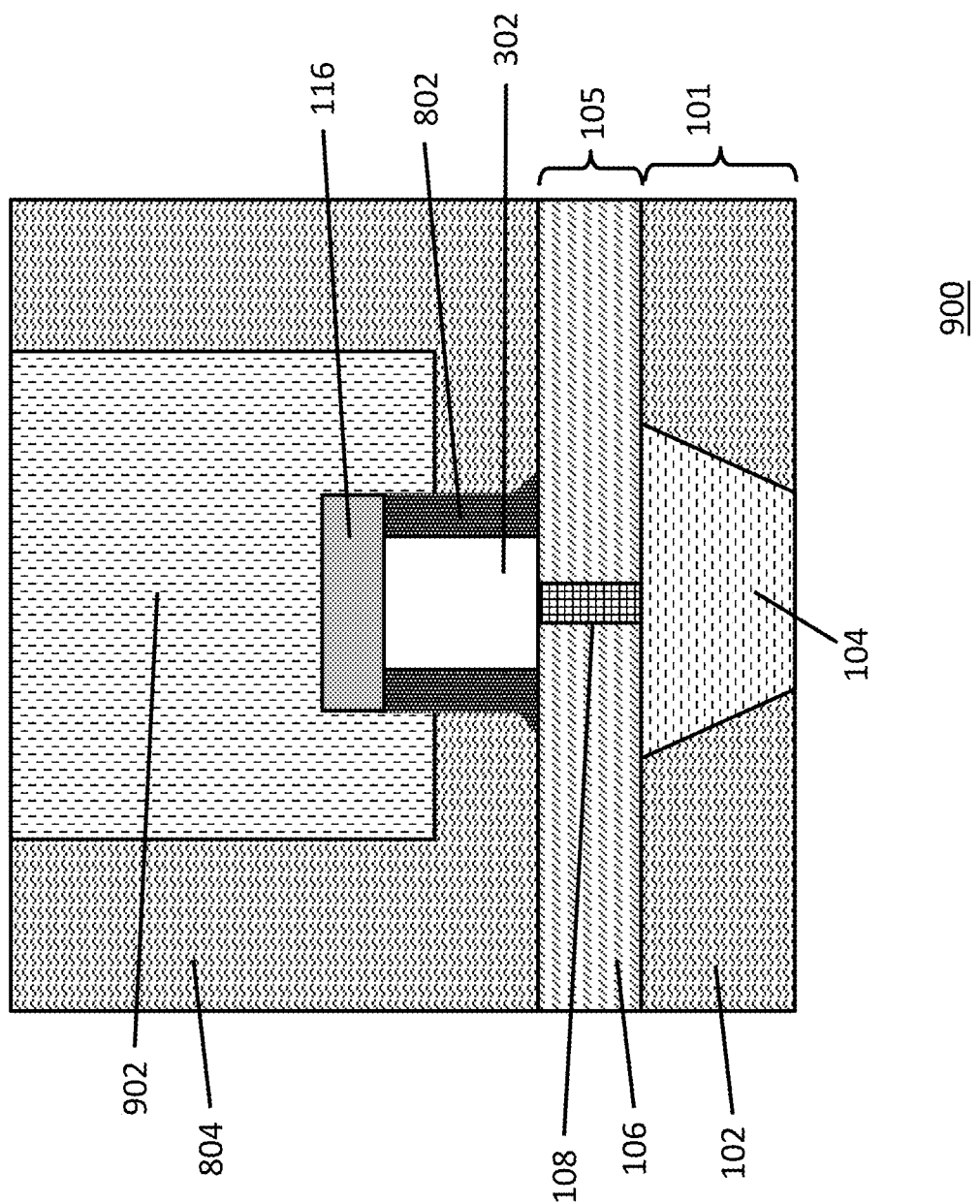
FIG. 9 is a cross sectional view of a structure formed after depositing an electrode in a trench of the exemplary structure of FIG. 8 in one embodiment.

FIG. 9 is a cross sectional view of a structure formed after depositing an electrode in a trench of the exemplary structure of FIG. 8 in one embodiment. In one embodiment, the structure 800 in FIG. 8 can undergo a deposition process to form another structure 900. To form the structure 900, materials of a top electrode 902 can deposited in the trench 806 of FIG. 8. The materials of the top electrode can be same as bottom electrode 104, such as metal or metallic compound, for example, titanium nitride (TiN) or tungsten (W). Further, the remaining hard mask 116 can be composed by conductive materials. The hard mask 116 can protect the phase change cell 302 and allow the phase change cell 302 to connect to the top electrode 902, effectively connecting the phase change cell 302 to any additional layer or component that may be deposited directly on the top electrode 902. The structure 900 can be a phase change memory element of a phase change memory cell among a plurality of phase change memory cells in a memory array.

Figure 10:
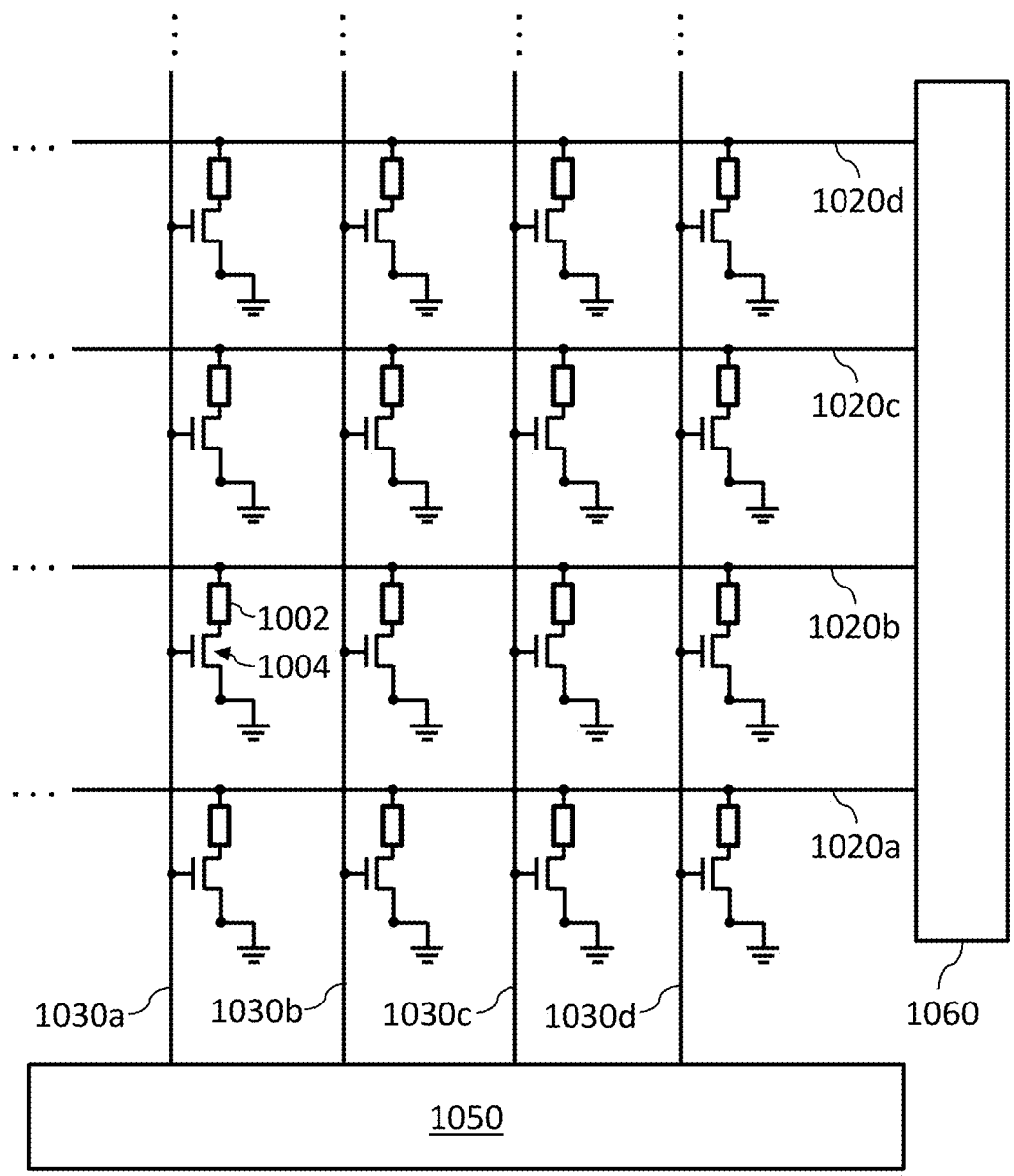
FIG. 10 is a diagram illustrating an example application of the structure 900 of FIG. 9 in one embodiment.

FIG. 10 is a diagram illustrating an example application of the structure 900 of FIG. 9 in one embodiment. In one embodiment, a portion of a phase change memory array 1000 can include a plurality of phase change memory cells, each phase change memory cell can include a phase change memory element 1002 and a transistor 1004. The phase change memory element 1002 can be, for example, the structure 900 of FIG. 9. In one embodiment, the transistor 1004 can be a field effect transistor (FET) with vertical channels. The input and output of each phase change memory cell are the gate and drain terminals of the transistor 1004, respectively. In one embodiment, the transistors 1004 can be arranged in a common source configuration, where the source terminal of the transistor 104 is coupled to a common voltage. In another embodiment, the source terminal of the transistor 104 can be coupled to ground. A plurality of word lines, such as 1030a, 1030b, 1030c, 1030d, can connect the gate terminals of the transistors 1004 to a decoder 1050. A plurality of bit lines, such as 1020a, 1020b, 1020c, 1020d, can connect the phase change memory elements 1002 to a decoder 1060. Reading or writing to phase change memory cells of the array 1000 can be achieved by applying an appropriate voltage or current to corresponding word lines and another appropriate voltage or current to corresponding bit lines to induce a current through the phase change memory elements. The level and duration of the voltages or currents being applied is dependent upon the operation performed, such as a reading operation or a writing operation.

Figure 11:
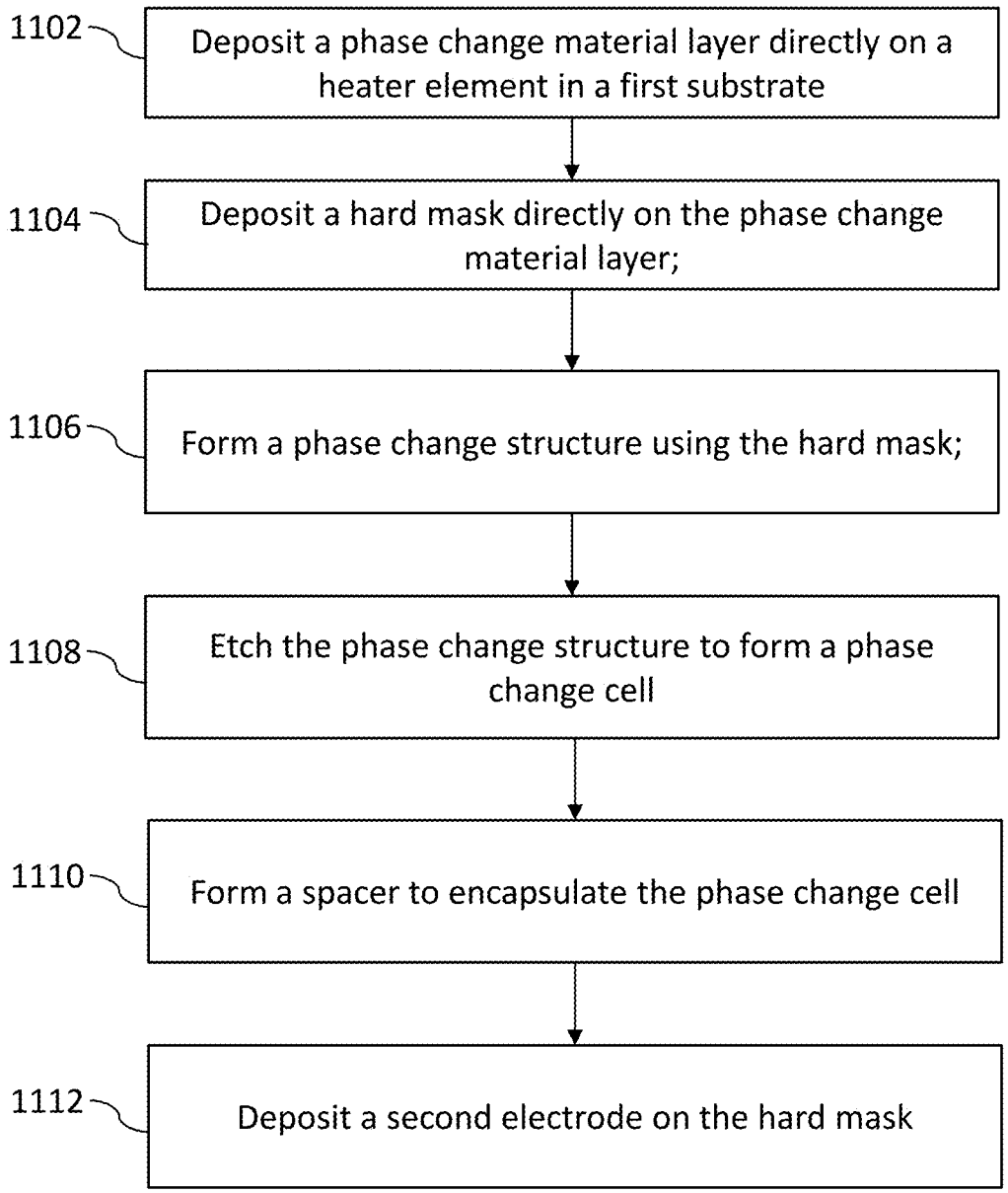
FIG. 11 is a flow diagram illustrating a method of forming phase change memory with encapsulated phase change element in one embodiment.

FIG. 11 is a flow diagram illustrating a method of forming phase change memory with encapsulated phase change element in one embodiment. An example process 1100 may include one or more operations, actions, or functions as illustrated by one or more of blocks 1102, 1104, 1106, and/or 1108. Although illustrated as discrete blocks, various blocks can be divided into additional blocks, combined into fewer blocks, eliminated, performed in different order, or performed in parallel, depending on the desired implementation.

The process 1100 can be performed to construct or form a semiconductor device, such as a phase change memory cell. The process 1100 can begin at block 1102. At block 1102, a phase change material layer can be deposited directly on a heater element in a first substrate. The heater element can be directly on a first electrode of a second substrate. The process 1100 can proceed from block 1102 to block 1104. At block 1104, a hard mask can be deposited directly on the phase change material layer. The process 1100 can proceed from block 1104 to block 1106. At block 1106, a phase change structure can be formed using the hard mask;

The process 1100 can proceed from block 1106 to block 1108. At block 1108, the phase change structure can be etched to form a phase change cell. The etching of the phase change structure causes the hard mask to overhang on the phase change cell. In one embodiment, the phase change cell can be etched by performing a selective etch laterally, the selective etch can be selective to the phase change material layer. In one embodiment, the phase change cell can be a GST structure.

The process 1100 can proceed from block 1108 to block 1110. At block 1110, a spacer can be formed to encapsulate the phase change cell. In one embodiment, the spacer can be formed by depositing a spacer layer that conforms to a contour of surfaces of the hard mask, the phase change cell, and the first substrate. The spacer layer can be patterned to form the spacer. In one embodiment, the spacer can be thermally and electrically insulated. In one embodiment, the spacer can include a spacer foot.

The process 1100 can proceed from block 1110 to block 1112. At block 1112, a second electrode can be deposited on the hard mask. In one embodiment, the hard mask can be a bi-layer hard mask including a first hard mask layer and a second hard mask layer. The second hard mask layer can be deposited directly on the first hard mask layer. In one embodiment, the first hard mask layer can be a titanium nitride (TiN) hard mask and the second hard mask layer can be a silicon nitride (SiN) hard mask. In one embodiment, the second hard mask layer can be removed, and the second electrode can be deposited on the first hard mask layer in response to removing the second hard mask layer.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be performed substantially concurrently, or the blocks may sometimes be performed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for forming a phase change memory element, the method comprising:
depositing a phase change material layer directly on a heater element in a first substrate, wherein the heater element is directly on a first electrode of a second substrate;

depositing a hard mask directly on the phase change material layer;

forming a phase change structure using the hard mask;

etching the phase change structure to form a phase change cell, wherein the etching of the phase change structure causes the hard mask to overhang on the phase change cell;

forming a spacer to encapsulate the phase change cell; and depositing a second electrode on the hard mask.

2. The method of claim 1, wherein the hard mask is a bi-layer hard mask including a first hard mask layer and a second hard mask layer, the second hard mask layer is deposited directly on the first hard mask layer.

3. The method of claim 2, wherein the first hard mask layer is a titanium nitride (TiN) hard mask and the second hard mask layer is a silicon nitride (SiN) hard mask.

4. The method of claim 2, further comprising removing the second hard mask layer, wherein depositing the second electrode comprises depositing the second electrode on the first hard mask layer in response to removing the second hard mask layer.

5. The method of claim 1, wherein etching the phase change cell comprises performing a selective etch laterally, the selective etch being selective to the phase change material layer.

6. The method of claim 1, wherein forming the spacer comprises:

depositing a spacer layer that conforms to a contour of surfaces of the hard mask, the phase change cell, and the first substrate; and patterning the spacer layer to form the spacer.

7. The method of claim 1, wherein the spacer is thermally and electrically insulated.

8. The method of claim 1, wherein the phase change cell is a GST structure.

9. The method of claim 1, wherein the spacer includes a spacer foot.

* * * * *